United States Patent
Chern

(10) Patent No.: US 6,967,372 B2
(45) Date of Patent: Nov. 22, 2005

(54) SEMICONDUCTOR MEMORY ARRAY OF FLOATING GATE MEMORY CELLS WITH VERTICAL CONTROL GATE SIDEWALLS AND INSULATION SPACERS

(75) Inventor: Geeng-Chuan Chern, Cupertino, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 415 days.

(21) Appl. No.: 09/916,618

(22) Filed: Jul. 26, 2001

(65) Prior Publication Data

US 2002/0146886 A1 Oct. 10, 2002

Related U.S. Application Data

(60) Provisional application No. 60/283,110, filed on Apr. 10, 2001.

(51) Int. Cl.[7] .................. H01L 29/788; H01L 29/76
(52) U.S. Cl. .................. 257/321; 257/319; 438/265
(58) Field of Search ..................... 257/321, 319; 438/265

(56) References Cited

U.S. PATENT DOCUMENTS

| | | |
|---|---|---|
| 4,757,360 A | 7/1988 | Faraone |
| 4,794,565 A | 12/1988 | Wu et al. |
| 4,882,707 A | 11/1989 | Mizutani |
| 4,931,847 A | 6/1990 | Corda |
| 4,947,221 A | 8/1990 | Stewart et al. |
| 5,021,848 A | 6/1991 | Chiu |
| 5,029,130 A | 7/1991 | Yeh |
| 5,041,886 A | 8/1991 | Lee |
| 5,101,250 A | 3/1992 | Arima et al. |
| 5,268,319 A | 12/1993 | Harari |
| 5,293,337 A | 3/1994 | Aritome et al. |
| 5,429,965 A | 7/1995 | Shimoji |
| 5,493,138 A * | 2/1996 | Koh ..................... 257/314 |

(Continued)

FOREIGN PATENT DOCUMENTS

EP  0 389 721 A2  10/1990

OTHER PUBLICATIONS

U.S. Appl. No. 09/401,622, filed Sep. 22, 1999, Johnson.

*Primary Examiner*—Howard Weiss
(74) *Attorney, Agent, or Firm*—DLA Piper Rudnick Gray Cary US LLP

(57) ABSTRACT

A self aligned method of forming a semiconductor memory array of floating gate memory cells in a semiconductor substrate having a plurality of spaced apart isolation regions and active regions on the substrate substantially parallel to one another in the column direction. Floating gates are formed in each of the active regions. Control gates are each formed with a substantially vertical face portion by covering a portion of a conductive layer with a protective layer, and performing an anisotropic etch to remove the exposed portion of the conductive layer. An insulation sidewall spacer is formed against the vertical face portion. The control gates have protruding portions that extend over the floating gates.

10 Claims, 8 Drawing Sheets

U.S. PATENT DOCUMENTS

| | | |
|---|---|---|
| 5,544,103 A | 8/1996 | Lambertson |
| 5,572,054 A | 11/1996 | Wang et al. |
| 5,751,048 A * | 5/1998 | Lee et al. ................ 257/412 |
| 5,780,341 A | 7/1998 | Ogura |
| 5,780,892 A | 7/1998 | Chen |
| 5,789,293 A | 8/1998 | Cho et al. |
| 5,796,139 A | 8/1998 | Fukase |
| 5,808,328 A | 9/1998 | Nishizawa |
| 5,811,853 A | 9/1998 | Wang |
| 5,814,853 A | 9/1998 | Chen |
| 6,091,104 A | 7/2000 | Chen |
| 6,103,573 A | 8/2000 | Harari et al. |
| 6,140,182 A | 10/2000 | Chen |
| 6,157,575 A | 12/2000 | Choi |
| 6,222,227 B1 | 4/2001 | Chen |
| 6,252,799 B1 | 6/2001 | Liu et al. |
| 6,329,685 B1 | 12/2001 | Lee |
| 6,563,167 B2 | 5/2003 | Chern |

* cited by examiner

SEMICONDUCTOR MEMORY ARRAY OF FLOATING GATE MEMORY CELLS WITH VERTICAL CONTROL GATE SIDEWALLS AND INSULATION SPACERS

PRIORITY

This application claims the benefit of U.S. Provisional Application No. 60/283,110, filed Apr. 10, 2001, and entitled Method to Form Vertical Word Line Side Wall For Self-Aligned NVM Cells.

TECHNICAL FIELD

The present invention relates to a self-aligned method of forming a semiconductor memory array of floating gate memory cells of the split gate type. The present invention also relates to a semiconductor memory array of floating gate memory cells of the foregoing type.

BACKGROUND OF THE INVENTION

Non-volatile semiconductor memory cells using a floating gate to store charges thereon and memory arrays of such non-volatile memory cells formed in a semiconductor substrate are well known in the art. Typically, such floating gate memory cells have been of the split gate type, or stacked gate type, or a combination thereof.

One of the problems facing the manufacturability of semiconductor floating gate memory cell arrays has been the alignment of the various components such as source, drain, control gate, and floating gate. As the design rule of integration of semiconductor processing decreases, reducing the smallest lithographic feature, the need for precise alignment becomes more critical. Alignment of various parts also determines the yield of the manufacturing of the semiconductor products.

Self-alignment is well known in the art. Self-alignment refers to the act of processing one or more steps involving one or more materials such that the features are automatically aligned with respect to one another in that step processing. Accordingly, the present invention uses the technique of self-alignment to achieve the manufacturing of a semiconductor memory array of the floating gate memory cell type.

In the split-gate architecture, the memory cells can be formed in mirrored pairs. FIG. 1A illustrates a partially formed pair of memory cells, with floating gates 1 disposed over a substrate 2. A source region 3 is formed in the substrate 2, and is electrically connected to a source line 4. Layers of insulating materials 5 insulate floating gate 1, substrate 2, source regions 3 and source line 4 from each other. Control gates are formed by first forming a layer 6 of conductive material (such as polysilicon) over the structure, as shown in FIG. 1A. An anisotropic poly etch is then performed to remove layer 5 except for spacer portions that form the control gates, as illustrated in FIG. 1B. The problem with this configuration is that the control gate spacers 6 have sloped side wall profiles 7 that are difficult to insulate so the remaining features of the memory cells (such as drain region and electrical contacts connected thereto) can be formed. As illustrated in FIG. 1C, insulation spacers 8 can be formed against part of the sloped sidewall portion, but most of the sloped side wall portions of control gates 6 are still exposed.

SUMMARY OF THE INVENTION

The present invention addresses the aforementioned needs by providing a self-aligned method of forming a semiconductor memory array of floating gate memory cells in a semiconductor substrate, where each memory cell has a floating gate, a first terminal, a second terminal with a channel region therebetween, and a control gate. The method includes the steps of:

a) forming a plurality of spaced apart isolation regions on the substrate which are substantially parallel to one another and extend in a first direction, with an active region between each pair of adjacent isolation regions, the active regions each comprising a first layer of insulation material on the semiconductor substrate and a first layer of conductive material on the first layer of insulation material;

b) forming a plurality of spaced apart blocks of insulation material in each of the active regions and over the first layer of conductive material;

c) forming a plurality of spaced apart blocks of conductive material in each of the active regions that are each disposed over and insulated from the substrate and adjacent to one of the blocks of insulation material;

d) forming a protective layer of material over a first portion of each of the blocks of conductive material, wherein a second portion of each of the blocks of conductive material is left uncovered by the layer of protective material;

e) etching away the second portions of the blocks of conductive material to form a substantially vertical sidewall portion on each of the blocks of conductive material;

f) forming a plurality of first terminals in the substrate, wherein in each of the active regions each of the first terminals has a side edge that is aligned to one of the substantially vertical sidewall portions; and g) forming a plurality of second terminals in the substrate, wherein in each of the active regions each of the second terminals is spaced apart from the first terminals.

In another aspect of the present invention, the method includes the steps of:

a) forming a plurality of spaced apart isolation regions on the substrate which are substantially parallel to one another and extend in a first direction, with an active region between each pair of adjacent isolation regions, the active regions each comprising a first layer of insulation material on the semiconductor substrate and a first layer of conductive material on the first layer of insulation material;

b) forming a plurality of spaced apart first trenches across the active regions and isolation regions which are substantially parallel to one another and extend in a second direction that is substantially perpendicular to the first direction and exposing the first layer of the conductive material in each of the active regions;

c) forming first side wall spacers of a material on side walls of the first trenches;

d) forming a second side wall spacer of a material on each of the first side wall spacers;

e) forming second trenches in each of the active regions adjacent to the first trenches, wherein the formation of the second trenches includes removing the first side wall spacers;

f) filling each of the second trenches with a second conductive material to form blocks of conductive material;

g) forming a protective layer of material over a first portion of each of the blocks of conductive material, wherein a second portion of each of the blocks of conductive material is left uncovered by the layer of protective material;

h) etching away the second portions of the blocks of conductive material to form a substantially vertical sidewall portion on each of the blocks of conductive material;

i) forming a plurality of first terminals in the substrate, wherein in each of the active regions each of the first terminals has a side edge that is aligned to one of the substantially vertical sidewall portions; and j) forming a plurality of second terminals in the substrate, wherein in each of the active regions each of the second terminals is spaced apart from the first terminals.

In yet another aspect of the present invention, an electrically programmable and erasable memory device includes a substrate of semiconductor material of a first conductivity type, first and second spaced-apart regions in the substrate of a second conductivity type with a channel region therebetween, a first insulation layer disposed over said substrate, an electrically conductive floating gate disposed over said first insulation layer and extending over a portion of the channel region and over a portion of the first region, a second insulation layer disposed over and adjacent the floating gate and having a thickness permitting Fowler-Nordheim tunneling of charges therethrough, an electrically conductive control gate having a first portion disposed adjacent to and insulated from the floating gate and a second portion extending over a portion of the second insulation layer and a portion of the floating gate, the control gate having a substantially vertical sidewall portion, and an insulation spacer formed adjacent to the substantially vertical sidewall portion of the control gate. The second region has an edge that is aligned with the substantially vertical sidewall portion.

In yet one more aspect of the present invention, an electrically programmable and erasable memory device includes a substrate of semiconductor material of a first conductivity type, first and second spaced-apart regions in the substrate of a second conductivity type, with a channel region therebetween, a first insulation layer disposed over said substrate, an electrically conductive floating gate disposed over said first insulation layer and extending over a portion of the channel region and over a portion of the first region, a second insulation layer disposed over and adjacent the floating gate and having a thickness permitting Fowler-Nordheim tunneling of charges therethrough, an electrically conductive control gate having a first portion disposed adjacent to and insulated from the floating gate and a second portion extending over a portion of the second insulation layer and a portion of the floating gate, the control gate having a substantially vertical sidewall portion, and an insulation spacer formed adjacent to the substantially vertical sidewall portion of the control gate. The second region has an edge that is aligned with the substantially vertical sidewall portion.

Other objects and features of the present invention will become apparent by a review of the specification, claims and appended figures.

DETAILED DESCRIPTION OF THE PREFERRED EMBODIMENTS

Figure 1A:
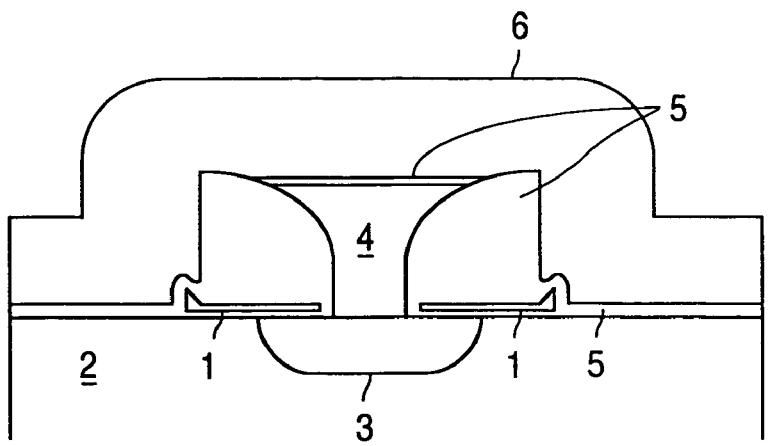
FIGS. 1A–1C are cross-sectional views of partially formed memory cells having control gates with sloping side wall profiles.
Figure 1B:
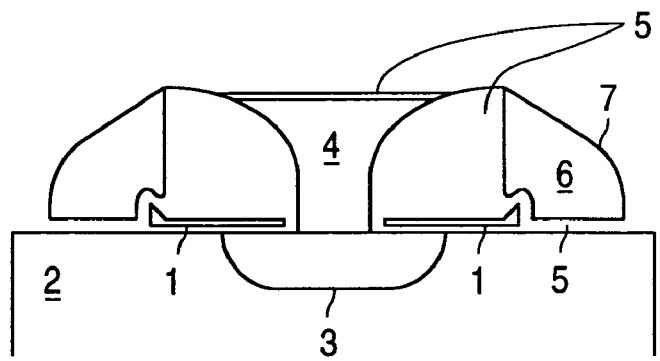
Figure 1C:
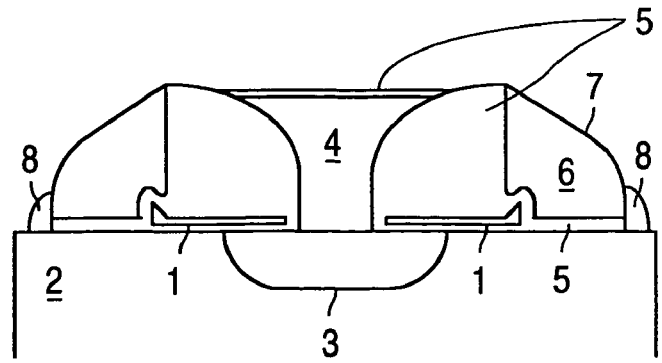
Figure 2A:
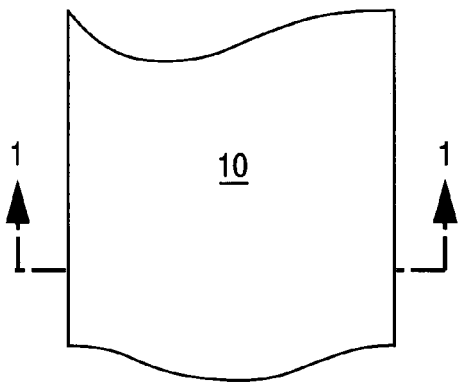
FIG. 2A is a top view of a semiconductor substrate used in the first step of the method of present invention to form isolation regions.
Figure 2B:
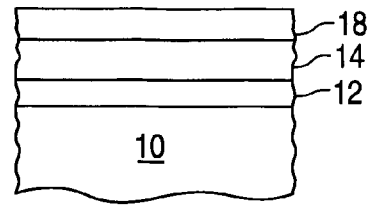
FIG. 2B is a cross sectional view of the structure of FIG. 2A taken along the line 1—1.

Referring to FIG. 2A there is shown a top plan view of a semiconductor substrate 10, which is preferably of P type and is well known in the art. A first layer of insulation material 12, such as silicon dioxide (oxide), is deposited thereon as shown in FIG. 2B. The first insulation layer 12 is formed on the substrate 10 by well known techniques such as oxidation or deposition (e.g. chemical vapor deposition or CVD), forming a layer of silicon dioxide (hereinafter "oxide"). A first layer of polysilicon 14 (FG poly) is deposited on top of the first layer of insulation material 12. The deposition and formation of the first polysilicon layer 14 on the first insulation layer 12 can be made by a well known process such as Low Pressure CVD or LPCVD. A silicon nitride layer 18 (hereinafter "nitride") is deposited over the polysilicon layer 14, preferably by CVD. This nitride layer 18 is used to define the active regions during isolation formation. Of course, all of the forgoing described parameters and the parameters described hereinafter, depend upon the design rules and the process technology generation. It will be understood by those skilled in the art that the present invention is not limited to any specific process technology generation, nor to any specific value in any of the process parameters described hereinafter.

Figure 2C:
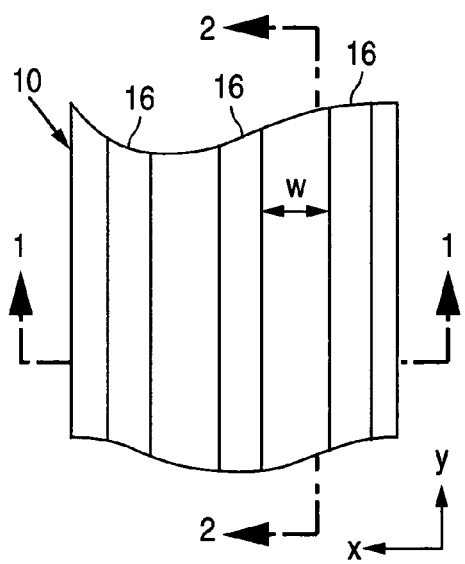
FIG. 2C is a top view of the next step in the processing of the structure of FIG. 2B, in which isolation regions are formed.

Once the first insulation layer 12, the first polysilicon layer 14, and the silicon nitride 18 have been formed, suitable photo-resistant material 19 is applied on the silicon nitride layer 18 and a masking step is performed to selectively remove the photo-resistant material from certain regions (stripes 16). Where the photo-resist material 19 is removed, the silicon nitride 18, the polysilicon 14 and the underlying insulation material 12 are etched away in stripes 16 formed in the Y direction or the column direction, as shown in FIG. 2C, using standard etching techniques (i.e. anisotropic etch process). The distance W between adjacent stripes 16 can be as small as the smallest lithographic feature of the process used. Where the photo resist 19 is not removed, the silicon nitride 18, the first polysilicon region 14 and the underlying insulation region 12 are maintained.

Figure 2D:
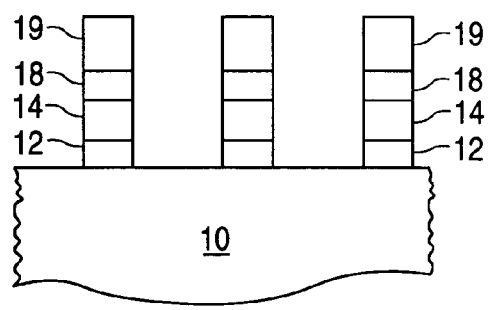
FIG. 2D is a cross sectional view of the structure in FIG. 2C taken along the line 1—1 showing the isolation stripes formed in the structure.

The resulting structure is illustrated in FIG. 2D. As will be described, there are two embodiments in the formation of the isolation regions: LOCOS and STI. In the STI embodiment, the etching continues into the substrate 10 to a predetermined depth.

The structure is further processed to remove the remaining photo resist 19. It should be noted that the above described etching of polysilicon 14, insulation material 12 and substrate 10 can be performed before or after photo resist 19 is removed. Then, an isolation material 20a or 20b, such as silicon dioxide, is formed in the regions or "grooves" 16. The nitride layer 18 is then selectively removed to form the structure shown in FIG. 2E. The isolation can be formed via the well known LOCOS process resulting in the local field oxide 20a (e.g. by oxidizing the exposed substrate), or it can be formed via a shallow trench isolation process (STI) resulting in silicon-dioxide being formed in the region 20b (e.g. by depositing an oxide layer, followed by a Chemical-Mechanical-Polishing or CMP etch). It should be noted that during the LOCOS formation, a spacer may be necessary to protect the side walls of poly layer 14 during the formation of the local field oxide.

Figure 2E:
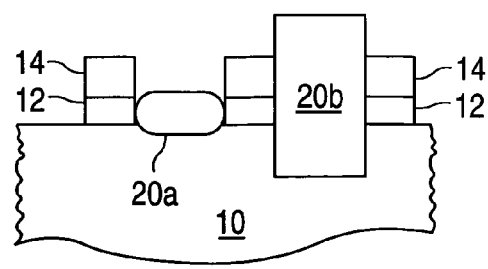
FIG. 2E is a cross sectional view of the structure in FIG. 2C taken along the line 1—1 showing the two types of isolation regions that can be formed in the semiconductor substrate: LOCOS or shallow trench.

The remaining first polysilicon layer 14 and the underlying first insulation material 12 form the active regions. Thus, at this point, the substrate 10 has alternating stripes of active regions and isolation regions with the isolation regions being formed of either LOCOS insulation material 20a or shallow trench insulation material 20b. Although FIG. 2E shows the formation of both a LOCOS region 20a and a shallow trench region 20b, only one of the LOCOS process (20a) or the shallow trench process (20b) will be used. In the preferred embodiment, the shallow trench 20b will be formed. Shallow trench 20b is preferable because it can be more precisely formed at smaller design rules.

The structure in FIG. 2E represents a self aligned structure, which is more compact than a structure formed by a non self-aligned method. A non self-aligned method of forming the structure shown in FIG. 2E, which is well known and is conventional, is as follows. Regions of isolation 20 are first formed in the substrate 10. This can be done by depositing a layer of silicon nitride on the substrate 10, depositing photo-resist, patterning the silicon nitride using a first masking step to expose selective portions of the substrate 10, and then oxidizing the exposed substrate 10 using either the LOCOS process or the STI process where silicon trench formation and trench fill are involved. Thereafter, the silicon nitride is removed, and a first layer of silicon dioxide 12 (to form the gate oxide) is deposited over the substrate 10. A first layer of polysilicon 14 is deposited over the gate oxide 12. The first layer of polysilicon 14 is then patterned using a second masking step and selective portions removed. Thus, the polysilicon 14 is not self aligned with the regions of isolation 20, and a second masking step is required. Further, the additional masking step requires that the dimensions of the polysilicon 14 have an alignment tolerance with respect to the regions of isolation 20. It should be noted that the non self-aligned method does not utilize nitride layer 18.

Figure 3A:
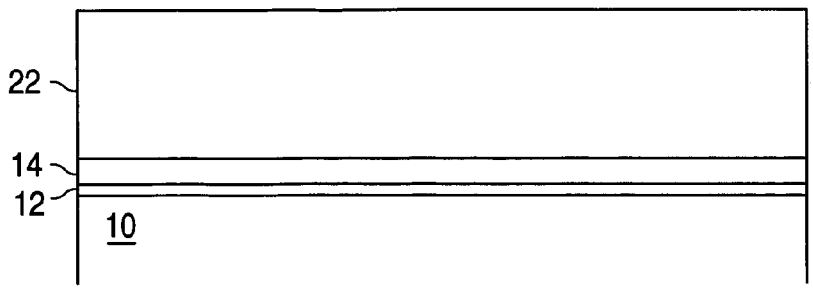
FIGS. 3A–3M are cross sectional views taken along the line 2—2 of FIG. 2C showing in sequence the next step(s) in the processing of the structure shown in FIG. 2C, in the formation of a non volatile memory array of floating memory cells of the split gate type.
Figure 3B:
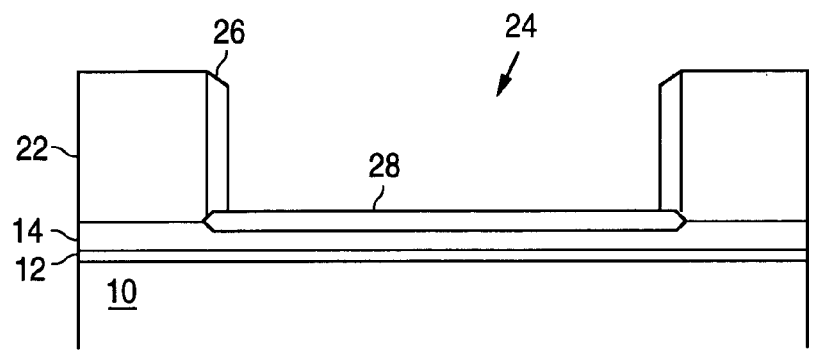

With the structure shown in FIG. 2E made using either the self aligned method or the non self-aligned method, the structure is further processed as follows. Referring to FIG. 3A, which shows the structure from a view orthogonal to that of FIGS. 2B and 2E, the next steps in the process of the present invention are illustrated. An insulation layer 22, such as nitride, is formed over the poly layer 14. A WL masking operation is performed with photo-resist applied on top of the nitride layer 22. A masking step is applied in which stripes (i.e. masking regions) are defined in the X or the row direction. The distance between adjacent stripes can be a size determined by the needs of the device to be fabricated. The photo resist is removed in defined masking regions, i.e. stripes in the row direction, after which nitride layer 22 underlying the removed photo resist is etched away in the stripes to expose the underlying poly layer 14. For each pair of mirror memory cells to be formed, this etch process results in the formation of a single first trench 24 that extends down to polysilicon layer 14. The remaining photoresist is then removed. This is followed by an oxidation process, which oxidizes the exposed portion of polysilicon layer 14 inside of trenches 24 to form a lens shaped oxide layer 28 over polysilicon layer 14. While not shown, an optional poly etch process can be performed before the formation of layer 28. This optional customized isotropic or sloped poly etch process etches away a portion of the top surface of poly layer 14, but leaves a taper shape in that top surface in the area next to the remaining nitride layer 22, with or without an undercut. Optional insulation side wall spacers 26 are then formed along the side wall surfaces of trenches 24. The formation of side wall spacers is well known in the art, by depositing a material over the contour of a structure, followed by an anisotropic etch process (e.g. RIE), whereby the material is removed from horizontal surfaces of the structure, while the material remains largely intact on vertically oriented surfaces of the structure. Spacers 26 can be formed of any dielectric material. In the preferred embodiment, insulation spacers 26 are formed of nitride. The resulting structure is shown in FIG. 3B.

Figure 3C:
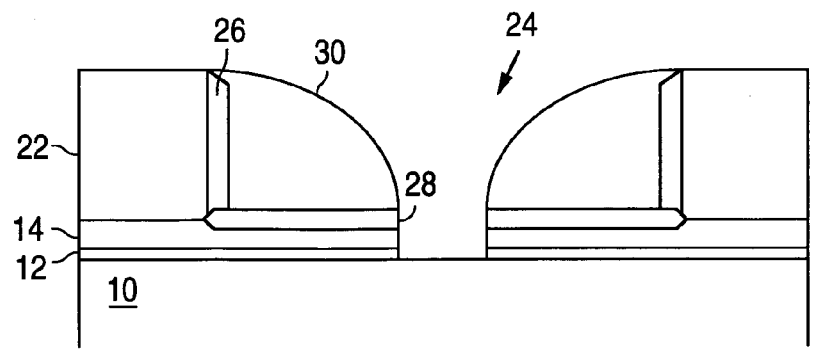

Insulation (oxide) side wall spacers 30 are then formed inside trenches 24 by depositing a thick layer of oxide, followed by an anisotropic oxide etch, which removes the deposited oxide except for spacers 30. This oxide etch step also removes the center portion of oxide layer 28 from each of the trenches 24. An anisotropic poly etch process is performed between the opposing insulation spacers 30 to remove the exposed poly layer 14 at the bottom of trenches 24 until the oxide layer 12 is observed, which acts as an etch stop. An oxide etch is then performed between spacers 30 to remove the thin oxide layer 12 at the bottom of trenches 24 to expose substrate 10. The use of spacers 30 allows the formation of trenches 24 having a width at the poly layer 14 that is less than the width of the masking step used to initially define the tops of trenches 24. The resulting structure is illustrated in FIG. 3C.

Figure 3D:
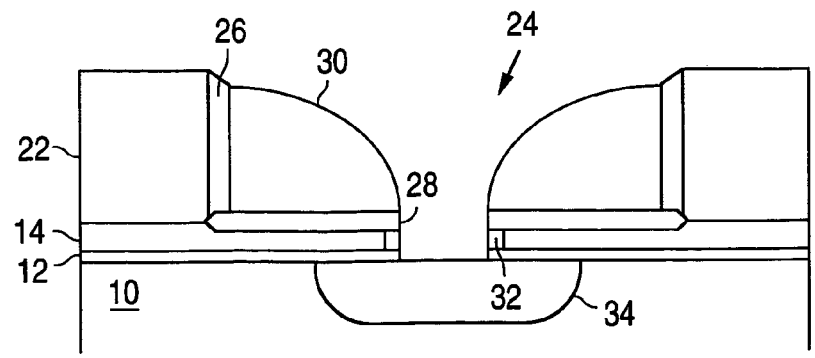

The sides of polysilicon layer 14 and the substrate surfaces that are exposed inside trenches 24 are oxidized in an oxidation step to form FG oxide side walls 32 on the sides of poly layer 14 and to reform oxide layer 12 over the substrate. Alternately, an insulation layer can be deposited followed by an anisotropic etch back process. Suitable ion implantation is then made across the entire surface of the structure. Where the ions have sufficient energy to penetrate the first silicon dioxide layer 12 in trench 24, they then form a first region (i.e. second terminal) 34 in the substrate 10. In all other regions, the ions are absorbed by the existing structure, where they have no effect. A controlled oxide etch step is then performed to remove the center portion of oxide layer 12 from each of the trenches 24 to expose the substrate 10. It should be noted that the ion implantation can alternately be performed after layer 12 is removed. The resulting structure is shown in FIG. 3D.

Figure 3E:
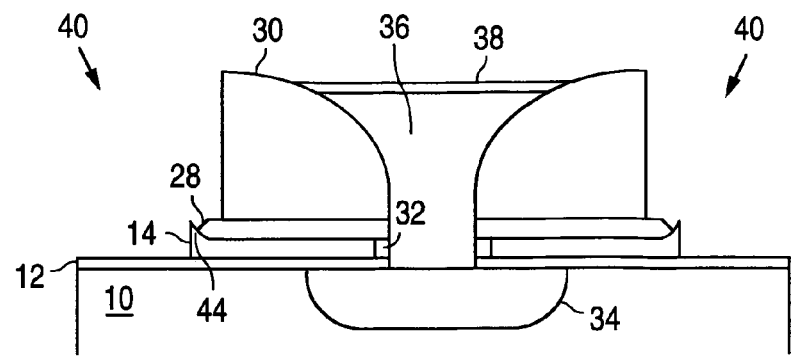

A poly deposition step is then performed, followed by a poly planarization (preferably by chemical-mechanical polishing (CMP)), to fill trenches 24 with poly blocks 36. A poly etchback step follows to remove excess polysilicon outside of trenches 24. The polysilicon is properly doped either through an in-situ method or by conventional implantation. An oxide layer 38 is then formed over each of the poly blocks 36 in trenches 24 by thermal oxidation, which grows oxide layer 38 only on poly blocks 36. A nitride etch is then performed to remove nitride layer 22 and nitride spacers 26. An anisotropic poly etch follows to remove the portion of poly layer 14 not covered by oxide spacers 30 and oxide layer 28. The poly etch effectively forms sharp edges 44 in poly layer 14. The nitride and poly etch steps effectively create second trenches 40, one on either side of the mirror set of memory cells. An optional oxide etch can be performed to remove a small portion of exposed oxide layer 28 to better expose sharp edge 44. The resulting structure is shown in FIG. 3E.

Figure 3F:
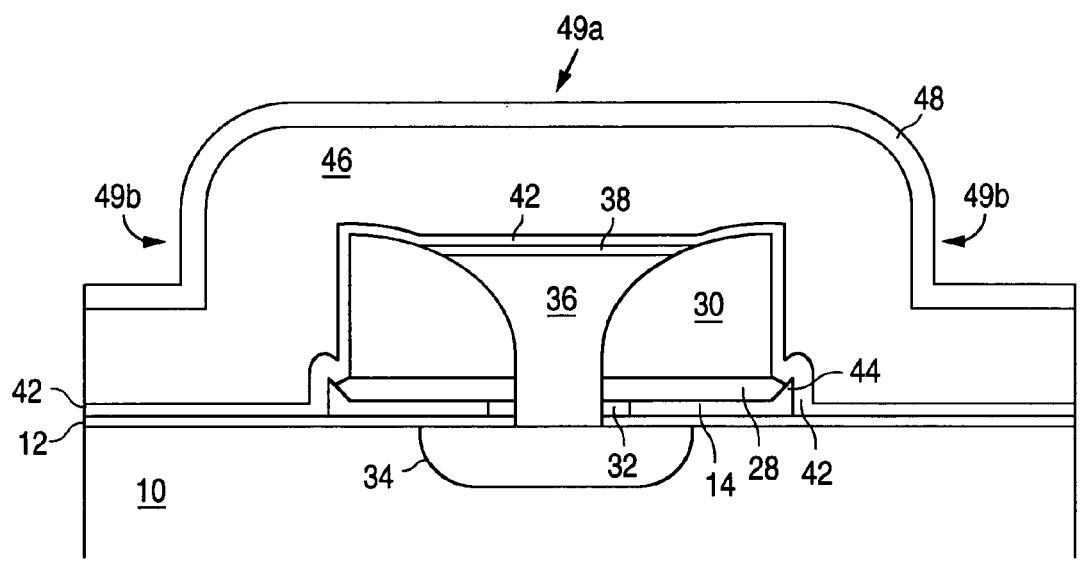

The next step is an oxide formation process, which forms an oxide layer 42 over the structure. Oxide layer 42 joins with oxide layer 28 to form an insulation layer that is disposed adjacent and over the polysilicon layer 14, and upwardly projecting sharp edges 44 at each side edge of polysilicon layer 14. The sharp edges 44 and the thickness of the insulation layer formed by oxide layers 42/28, permit Fowler-Nordheim tunneling of charges therethrough. A thick WL poly layer 46 is formed over the structure (filling trenches 40), which is followed by the formation of a nitride layer 48 over the poly layer 46, as illustrated in FIG. 3F. Preferably, nitride layer 48 is 10–300 mn thick. For each memory cell pair, the resulting structure has a raised central portion 49a and lower side portions 49b.

Figure 3G:
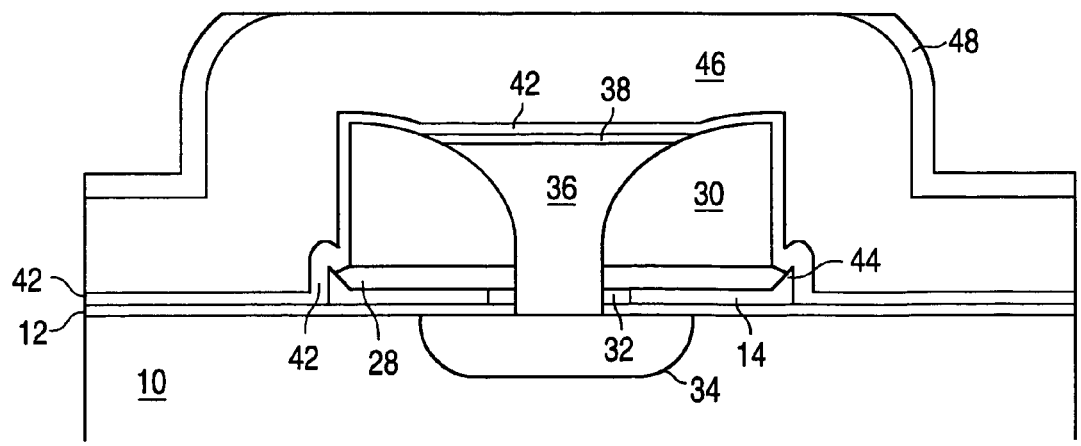
Figure 3H:
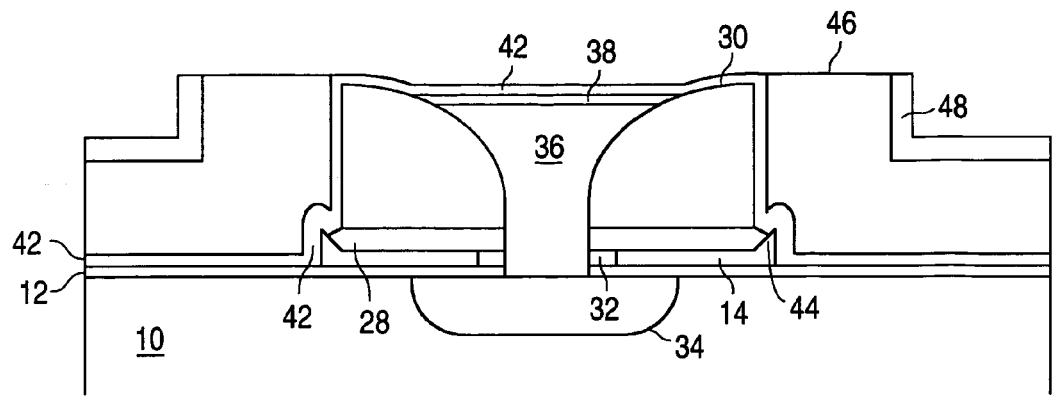

A planarization process follows, such as CMP, which removes the nitride layer 48 of the raised central portions 49a, as shown in FIG. 3G. The process is continued to remove the raised central portions of poly layer 46 and side portions of nitride layer 48 thereon, using oxide layer 42 as an etch stop, as shown in FIG. 3H. It is preferred that the slurry chosen for CMP should not etch nitride, but rather etch polysilicon only. Most of the mechanical polishing stress is applied to the poly layer 46, and it is undesirable to have the slurry etch away the relatively thin nitride layer 48 on either side of the poly layer 46. Preferably, the nitride layer 48 is removed mainly by mechanical polishing, so that once this CMP process is complete, portions of nitride layer 48 on the lower side portions of poly layer 46 remain intact (to later serve as an oxidation protection layer).

Figure 3I:
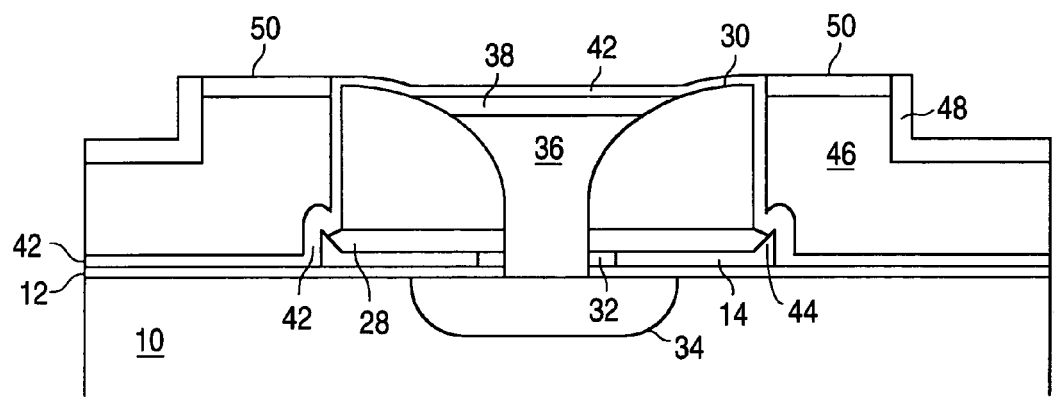
Figure 3J:
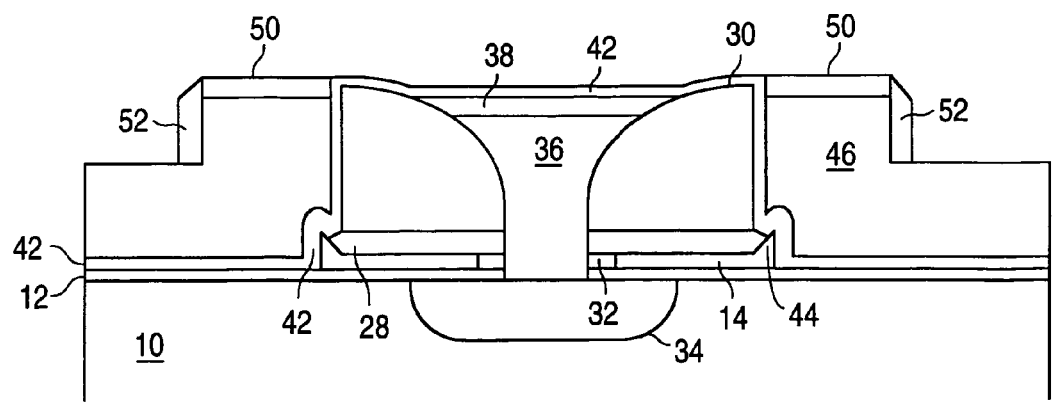

Poly layer 46 is partially covered and protected by nitride layer 48, with other portions that are left exposed by the CMP process. A layer of oxide 50 is formed on those exposed portions of poly layer 46, preferably by an oxidation step, as shown in FIG. 3I. The oxide layer 50 is preferably 8–80 mn thick. An anisotropic nitride etch process follows, which removes nitride layer 48 from the horizontal surfaces of the structure, leaving nitride side wall spacers 52 over poly layer 46, as shown in FIG. 3J.

Figure 3K:
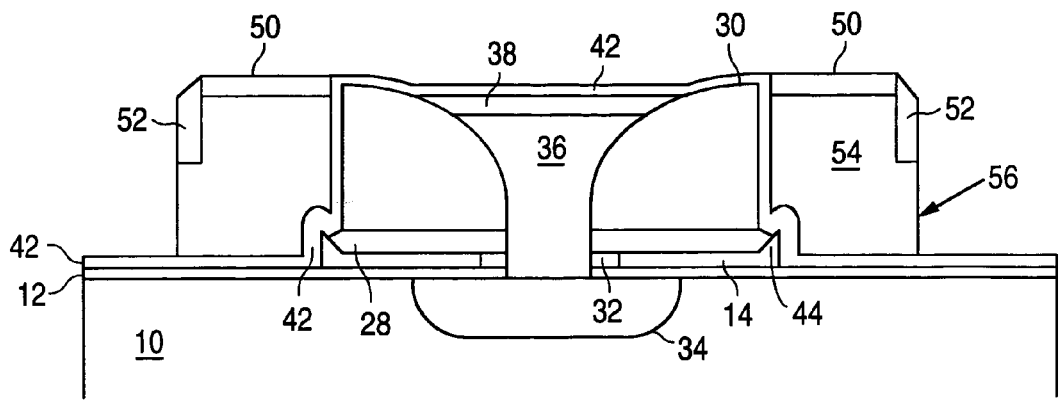
Figure 3L:
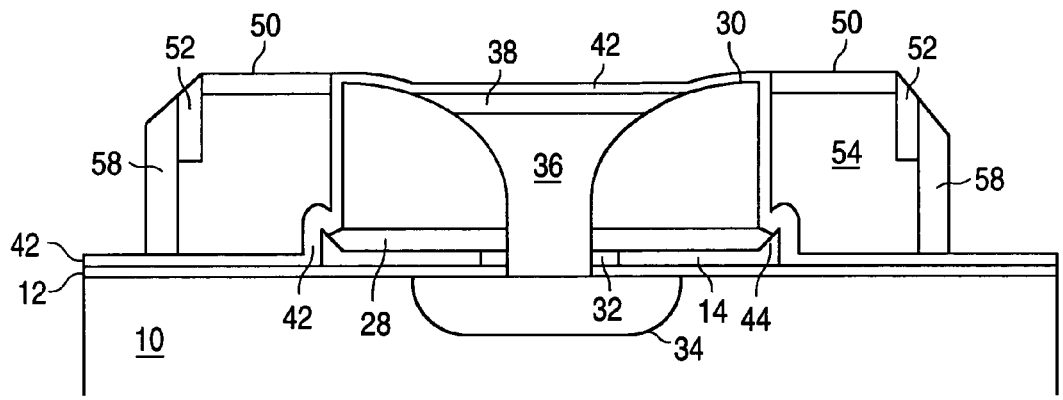

An anisotropic poly etch step is performed to remove the exposed portions of poly layer 46. The portions of poly layer 46 protected from the anisotropic etch process by oxide layer 50 and nitride spacers 52 form blocks 54 of polysilicon 54, as shown in FIG. 3K. Poly blocks 54 have vertical side walls 56 resulting from the anisotropic etch and protective oxide layer 50. The vertical sidewalls are ideal for spacer formation as follows. Nitride side wall spacers 58 are formed adjacent vertical side walls 56 of poly blocks 54 by depositing nitride over the structure followed by an anisotropic nitride etch (such as RIE dry etch) to remove all the added nitride except for side wall spacers 58, as shown in FIG. 3L. Side wall spacers 58 not only insulate poly blocks 54, but also facilitate the formation of self aligned salicide and contacts for the second regions as described next. Ion implantation (e.g. N+) is used to form second regions (i.e. first terminals) 60 in the substrate in the same manner as the first regions 34 were formed, as shown in FIG. 3M. A thin oxide etch is performed to remove any exposed portions of oxide layers 12 and 42 over substrate 10, and oxide layers 38, 42 and 50 over the structure. A metal deposition step is then performed, to deposit a metal such as tungsten, cobalt, titanium, nickel, platinum, or molybdenum over the structure. The structure is then annealed, permitting the metal to react with the exposed top portions of the substrate 10 and poly blocks 36/54 to form a conductive layer of metalized silicon 62 (silicide) on the substrate next side wall spacers 58, and a conductive layer of metalized silicon 63 over the poly blocks 36 and 54. Metalized silicon regions 62 on substrate 10 can be called self aligned silicide (i.e. salicide), because they are self aligned to the second regions 60 by spacers 58. Metalized silicon regions 63 facilitate conduction along the connected rows of poly blocks 36 and 54. The unreacted metal deposited on the remaining structure is removed by a metal etch process.

Passivation, such as BPSG 64, is used to cover the entire structure. A masking step is performed to define etching areas over the salicide regions 62. The BPSG 64 is selectively etched in the masked regions to create contact openings that are ideally centered over and wider than the salicide regions 62 formed between adjacent sets of paired memory cells. Nitride spacers 52 and 58 serve to protect poly blocks 54 from this etch process. The contact openings are then filled with a conductor metal 66 by metal deposition and planarizing etch-back, whereby the entire area between nitride spacers 58 of adjacent sets of paired memory cells is filled with the deposited metal to form contact conductors 66 that are self aligned to the salicide regions 62 by the nitride spacers 58 (i.e. self aligned contact scheme, or SAC). The salicide layers 62 facilitate conduction between the conductors 66 and second regions 60. Bit lines 68 are added by metal masking over the BPSG 64, to connect together all the conductors 66 in each column of memory cells. The final memory cell structure is illustrated in FIG. 3M.

The self aligned contact scheme (SAC) removes an important constraint on the minimum spacing requirement between adjacent sets of paired memory cells. Specifically, while FIG. 3M illustrates the contact area (and thus conductors 66) perfectly centered over the salicide regions 62, in reality it is very difficult to form the contact openings without some undesirable horizontal shift relative to the salicide regions 62. With a non-self aligned contact scheme, where there is no protective insulation layer over the structure before BPSG formation, electrical shorts can occur if the contact 66 is shifted over and formed over poly block 54. To prevent electrical shorts in a non-self aligned contact scheme, the contact openings would have to be formed sufficiently away from the nitride spacers 58 so that even with the maximum possible shift in the contact regions, they will not extend to nitride spacers 58 or beyond. This of course would present a constraint on the minimum distance between spacers 58, in order to provide a sufficient tolerance distance between adjacent sets of paired mirror cells.

The SAC method of the present invention eliminates this constraint by forming the protective layer of material (nitride spacers 52 and 58) underneath the BPSG. With this protective layer, the contact openings are formed in the BPSG with a sufficient width to ensure there is overlap of the contact opening with the salicide regions 62, even if there is a horizontal shift of the contact opening during formation. Nitride spacers 52 and 58 allow portions of contacts 66 to be formed over poly blocks 54 without any shorting therebetween. The wide contact opening guarantees that contacts 66 completely fill the very narrow spaces between spacers 58, and makes good electrical contact with salicide regions 62. Thus, the width of contact regions between spacers 58 can be minimized to allow the scaling down of the overall cell dimension.

As shown in FIG. 3M, first and second regions 34/60 form the source and drain for each cell (those skilled in the art know that source and drain can be switched during operation). A channel region 70 for each cell is defined as the portion of the substrate that is in-between the source and drain 34/60. Poly blocks 54 constitute the control gates, and poly layer 14 constitutes the floating gate. The control gates 54 are generally rectangular in shape, but with a lower first portion 72 that is disposed adjacent the floating gate 14 (insulated therefrom by oxide layer 42), and an upper second portion 74 that protrudes over a portion of floating gate 14 and forms a notch 76. The sharp edge 44 of floating gate 14 extends into the notch 76. Floating gate 14 is over part of the channel region 70, is partially overlapped at one end by the control gate 54, and partially overlaps the first region 34 with its other end. As illustrated in the FIG. 3M, the process of the present invention forms pairs of memory cells that mirror each other. Each pair of mirrored memory cells is insulated from adjacent pairs of mirrored memory cells by nitride spacers 58.

Figure 3N:
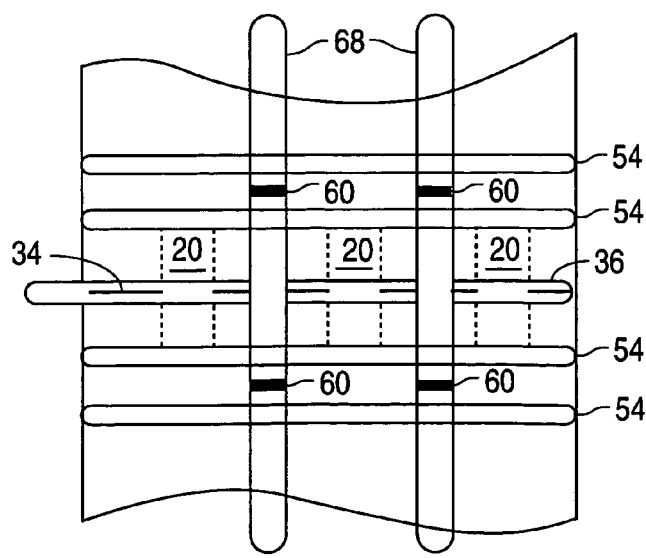
FIG. 3N is a top view showing the interconnection of row lines and bit lines to terminals in active regions in the formation of the non volatile memory array of floating memory cells of the split gate type.
Figure 3M:
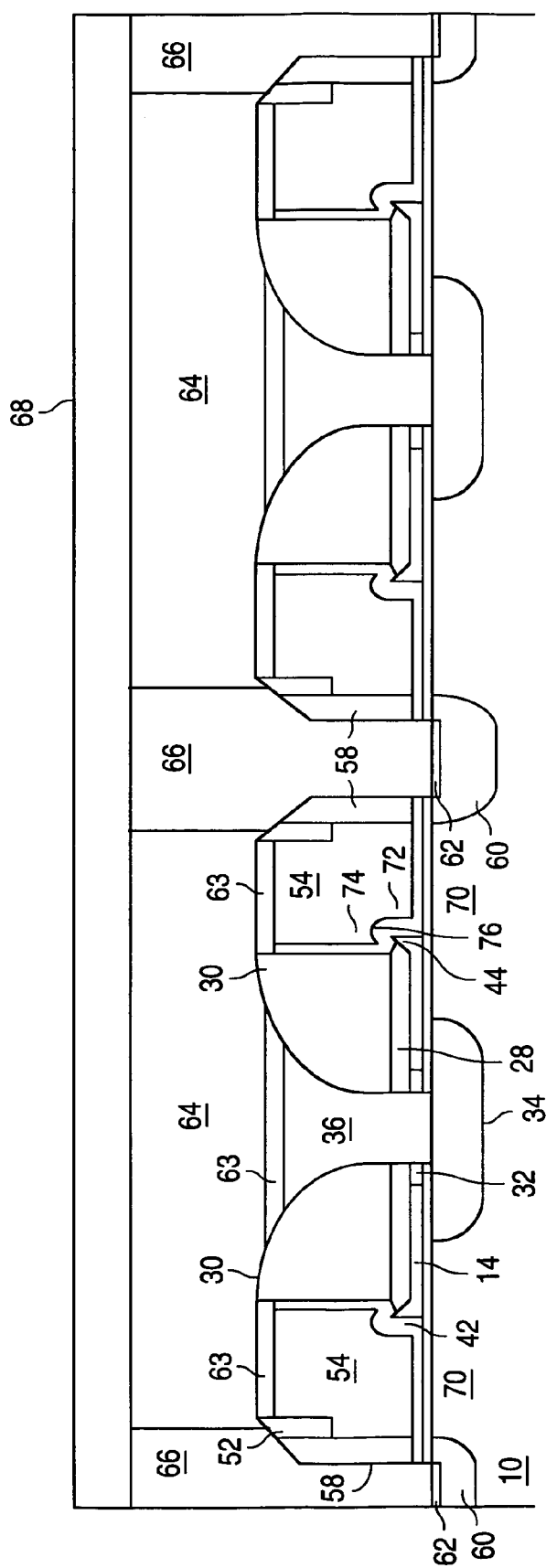

Referring to FIG. 3N, there is shown a top plan view of the resulting structure and the interconnection of the bit lines 68 to the second regions 60 and of the control lines 54 which run in the X or the row direction and finally the source lines 36 which connect to the first regions 34 within the substrate 10. Although the source lines 36 (as should be understood by those skilled in the art, the word "source" is interchangeable with the word "drain") make contact with the substrate 10 in the entire row direction, i.e. contact with the active regions as well as the isolation regions, the source lines 36 electrically connect only to the first regions 34 in the substrate 10. In addition, each first region 34 to which the "source" line 36 is connected is shared between two adjacent memory cells. Similarly, each second region 60 to which the bit line 68 is connected is shared between adjacent memory cells from different mirror sets of memory cells.

The result is a plurality of non volatile memory cells of the split gate type having a floating gate 14, a control gate 54 which is immediately adjacent to but separated from the floating gate 14 and connected to a substantially rectangularly shaped structure which runs along the length of the row direction connecting to the control gates of other memory cells in the same row, a source line 36 which also runs along the row direction, connecting the first regions 34 of pairs of memory cells in the same row direction, and a bit line 68 which runs along the column or Y direction, connecting the second regions 60 of pairs of memory cells in the same column direction. The formation of the control gate, the floating gate, the source line, and the bit line, are all self-aligned. A key feature of the present invention is the formation of a protective layer or layers over the polysilicon that forms the control gates, and etching the remaining unprotected polysilicon so that the control gates each have a vertical sidewall that is conducive to spacer formation. The non-volatile memory cell is of the split gate type having floating gate to control gate tunneling as described in U.S. Pat. No. 5,572,054, whose disclosure is incorporated herein by reference with regard to the operation of such a non-volatile memory cell and an array formed thereby.

Figure 4A:
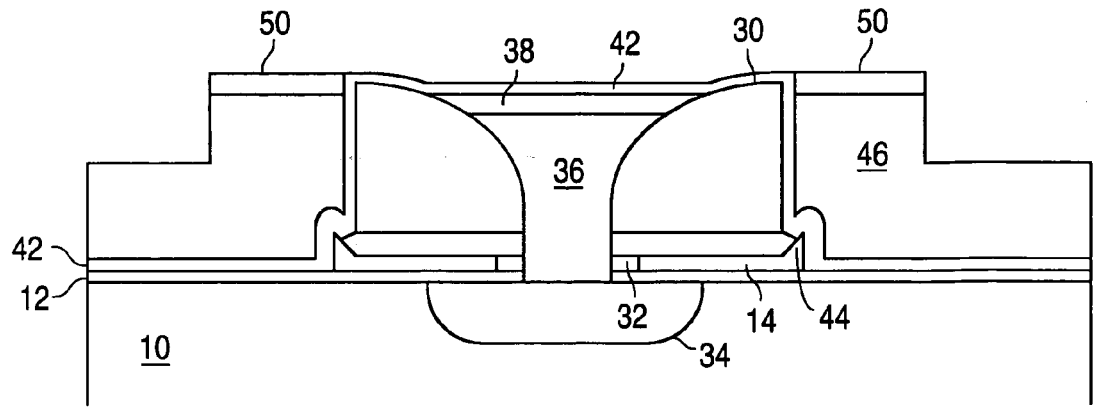
FIGS. 4A–4C are cross sectional views taken along the line 2—2 of FIG. 2C showing in sequence the steps in a first alternate processing of the structure shown in FIG. 3I, in the formation of a non volatile memory array of floating memory cells of the split gate type.
Figure 4B:
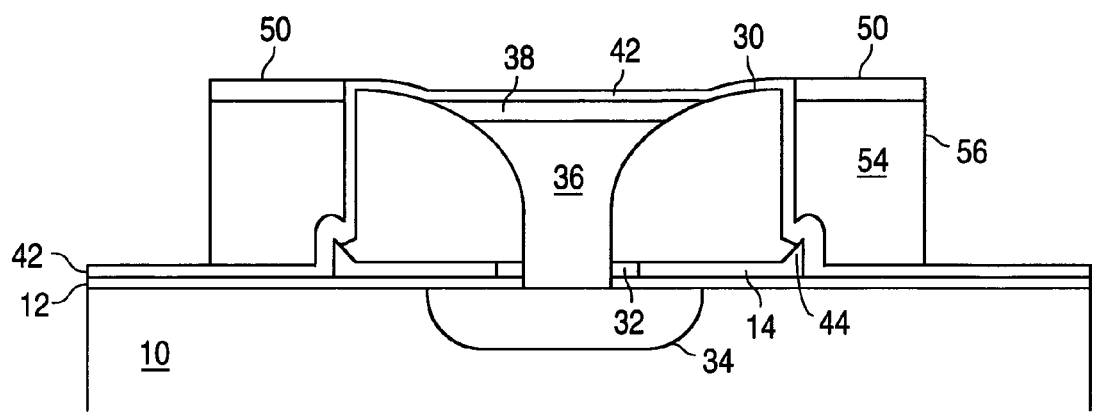
Figure 4C:
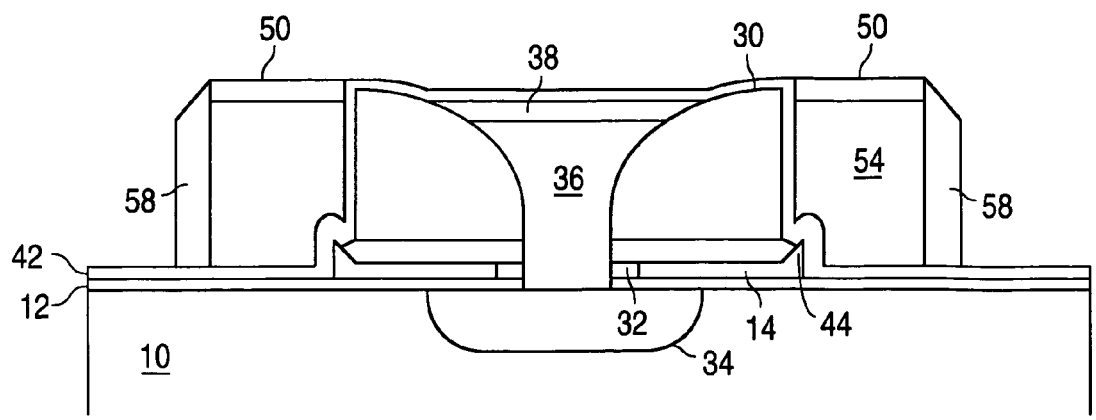

FIGS. 4A–4C illustrate an alternate process for forming a memory cell array similar to that illustrated in FIG. 3M, but without the use of spacers 52 in the finished device. This alternate process begins with the same structure as shown in FIG. 3I, but continues as follows. Instead of an anisotropic nitride etch which results in spacers 52, an isotropic nitride etch is used to remove all of nitride layer 48, as illustrated in FIG. 4A.

An anisotropic poly etch step is then performed to remove the exposed portions of poly layer 46, which leaves blocks of polysilicon 54 underneath oxide layer 50, as shown in FIG. 4B. Poly blocks 54 have vertical side walls 56 that are conducive to spacer formation, and are insulated from above by oxide layer 50. Nitride side wall spacers 58 are then formed adjacent vertical side walls 56 of poly blocks 54 by depositing nitride over the structure followed by an anisotropic nitride etch (such as RIE dry etch) to remove all the added nitride except for side wall spacers 58, as shown in FIG. 4C. Poly blocks 54 are fully insulated from above by oxide layer 50 and from the side by nitride spacers 58. Side wall spacers 58 not only insulate poly blocks 54, but also facilitate the formation of salicide and contacts for the second regions. The remaining steps discussed above with respect to the preferred embodiment are then performed to complete the memory cell array.

It is to be understood that the present invention is not limited to the embodiments described above and illustrated herein, but encompasses any and all variations falling within the scope of the appended claims. For example, although the foregoing method describes the use of appropriately doped polysilicon as the conductive material used to form the memory cells, it should be clear to those having ordinary skill in the art that any appropriate conductive material can be used. In addition, any appropriate insulator can be used in place of silicon dioxide or silicon nitride. Moreover, any appropriate material whose etch property differs from silicon dioxide (or any insulator) and from polysilicon (or any conductor) can be used in place of silicon nitride. Further, as is apparent from the claims, not all method steps need be performed in the exact order illustrated or claimed, but rather in any order that allows the proper formation of the memory cell of the present invention.

What is claimed is:

1. An electrically programmable and erasable memory device comprising:

a substrate of semiconductor material of a first conductivity type;

first and second spaced-apart regions in the substrate of a second conductivity type, with a channel region therebetween;

a first insulation layer disposed over said substrate;

an electrically conductive floating gate disposed over said first insulation layer and extending over a portion of the channel region and over a portion of the first region;

a second insulation layer having a first portion disposed over said first insulation layer and said substrate, a second portion disposed adjacent the floating gate and a third portion disposed over the floating gate, wherein the second insulation layer has a thickness permitting Fowler-Nordheim tunneling of charges therethrough;

an electrically conductive control gate having a first portion disposed over the second insulation layer first portion and adjacent to the second insulation layer second portion, and a second portion extending over the second insulation layer third portion, the control gate having a substantially vertical sidewall portion; and an insulation spacer formed adjacent to the substantially vertical sidewall portion of the control gate;

wherein the second region has an edge that is aligned with the substantially vertical sidewall portion.

2. The device of claim 1, further comprising:
a third insulation layer formed over a top surface of the control gate.

3. The device of claim 1, wherein the floating gate includes a sharp edge portion that extends toward the control gate.

4. The device of claim 3, the first and second portions of the control gate form a notch into which the sharp edge portion of the floating gate extends.

5. The device of claim 1 further comprising:
a layer of metalized silicon formed on the second region and aligned to the insulation spacer.

6. An array of electrically programmable and erasable memory devices comprising:
a substrate of semiconductor material of a first conductivity type;
spaced apart isolation regions formed on the substrate which are substantially parallel to one another and extend in a first direction, with an active region between each pair of adjacent isolation regions;
each of the active regions including a column of memory cells extending in the first direction, each of the memory cells including:
first and second spaced-apart regions formed in the substrate having a second conductivity type, with a channel region formed in the substrate therebetween,
a first insulation layer disposed over said substrate including over said channel region,
an electrically conductive floating gate disposed over said first insulation layer and extending over a portion of the channel region and over a portion of the first region, and
a second insulation layer having a first portion disposed over said first insulation layer and said substrate, a second portion disposed adjacent the floating gate and a third portion disposed over the floating gate, wherein the second insulation layer has a thickness permitting Fowler-Nordheim tunneling of charges therethrough; and
a plurality of electrically conductive control gates each extending across the active regions and isolation regions in a second direction substantially perpendicular to the first direction and having a first portion and a second portion, wherein each of the control gates intercepts one of the memory cells in each of the active regions such that the control gate first portion is positioned over the second insulation layer first portion and adjacent to the second insulation layer second portion and the control gate second portion extends over the second insulation layer third portion, and wherein each of the control gates has a substantially vertical sidewall portion; and
a plurality of insulation spacers each formed adjacent to one of the substantially vertical sidewall portions of the control gates;
wherein the second region has an edge that is aligned with the substantially vertical sidewall portion.

7. The device of claim 6, further comprising:
a third insulation layer formed over a top surface of each of the control gates.

8. The device of claim 6, wherein each of the floating gates includes a sharp edge portion that extends toward one of the control gates.

9. The device of claim 8, wherein for each of the control gates, the first and second portions form a notch into which the sharp edge portion of the floating gate extends.

10. The device of claim 6, further comprising:
a layer of metalized silicon formed on each of the second regions and aligned to the corresponding insulation spacer.

* * * * *